United States Patent
Grasso et al.

(10) Patent No.: US 6,828,753 B2
(45) Date of Patent: Dec. 7, 2004

(54) INPUT FILTER FOR A.C. MOTOR PHASE CURRENT SENSING

(75) Inventors: Massimo Grasso, S. Martino S. (IT); Sergio Morini, Pavia (IT); Alessandro Rugginenti, Colombano al Lambro (IT)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/644,666

(22) Filed: Aug. 20, 2003

(65) Prior Publication Data

US 2004/0056627 A1 Mar. 25, 2004

Related U.S. Application Data

(60) Provisional application No. 60/406,217, filed on Aug. 26, 2002.

(51) Int. Cl.$^7$ .................................................. H02P 5/34
(52) U.S. Cl. ........................ 318/801; 318/599; 318/811
(58) Field of Search ................................ 318/801, 599; 318/807; 363/34

(56) References Cited

U.S. PATENT DOCUMENTS

| | | |
|---|---|---|
| 5,486,743 A | 1/1996 | Nagai |
| 6,014,007 A | 1/2000 | Seibel et al. |
| 6,534,948 B2 | 3/2003 | Ohura et al. |
| 2002/0163819 A1 * | 11/2002 | Treece .......................... 363/34 |
| 2003/0035308 A1 * | 2/2003 | Lynch et al. ................. 363/34 |

\* cited by examiner

*Primary Examiner*—Karen Masih
(74) *Attorney, Agent, or Firm*—Ostrolenk, Faber, Gerb & Soffen, LLP

(57) ABSTRACT

An input filter to block noise components of motor phase current used as an input signal for a PWM motor controller. The input filter includes an integration circuit driven by a triggering signal at a frequency which is twice the frequency of operation of the inverter. In one embodiment, a first integrator is coupled directly to the motor drive current signal, and a second integrator is coupled to the motor drive current signal through a circuit which introduces a delay equal to the period of the triggering signal. The difference between the outputs of the integrators is then sampled at the triggering signal frequency. In a second embodiment, a voltage-to-time converter generates a first ramp representing the integral of the phase current signal during a first triggering interval, and a second ramp representing the integral of a reference signal, is subtracted from the value of the first ramp during a second triggering interval until value of integrator output returns to zero. In a third embodiment, a switched capacitor integration circuit is operated by a high speed clock synchronized to the triggering signal. The integrator output is sampled at the end of each triggering period and coupled to an analog to digital converter.

30 Claims, 6 Drawing Sheets

INPUT FILTER FOR A.C. MOTOR PHASE CURRENT SENSING

RELATED APPLICATIONS

This application claims priority to U.S. Provisional Application No. 60/406,217, filed Aug. 26, 2002, the content of which is incorporated by reference herein, as if fully set forth.

BACKGROUND OF THE INVENTION

1. Field of the Invention

The present invention relates to input filters for phase current sensing circuits used in A.C. motor drive systems, and more particularly to improved filters for eliminating ripple noise which can affect the accuracy of motor current control.

2. Relevant Art

Modern motor drives generally utilize pulse width modulation (PWM) switched inverters to generate motor drive currents having precisely controlled characteristics. Such systems are particularly advantageous because they are low in cost, and exhibit low power dissipation.

FIG. 1 shows a simplified schematic diagram of a conventional PWM motor drive, generally denoted at 10. Here, incoming two or three-phase A.C. power is provided to a rectifier circuit 12 which provides D.C. to an inverter 14 on buses 16 and 18. The inverter, in turn, provides controlled alternating current to motor 20 over lines 22a–22c.

Numerous inverter designs exist, but these generally incorporate pairs of power semiconductor switches (not shown) such as metal oxide semiconductor field effect transistors (MOSFETS) or insulated gate bipolar transistors (IGBTS) for each motor phase. These are switched on and off by pulse width modulated (PWM) gate control signals provided by a PWM control circuit 24 over a signal path 26.

For a three-phase motor, control circuit 24 compares a triangular wave at a fixed frequency $f_{PWM}$ with three sinusoidal reference signals that are 120° out of phase, and generates the PWM gate drive signals at the cross-over points between the triangular wave and the reference signals. The reference signals are derived from phase current feedback signals which can be provided in various ways, e.g., by measuring the voltage drops across sensing resistors 28a–28c in motor current drive lines 22a–22c. The desired motor speed may be determined according to an independently controlled speed set point signal 30. This technology is well known to persons skilled in the art, and further description will be omitted in the interest of brevity.

A major problem with PWM inverter motor drives is that the current provided by inverter 14 contains a significant ripple component. The typical appearance of the drive current is illustrated in FIG. 2, line (a). This is comprised of a signal component, typically in the 0–500 Hz range (line (b)), and an inverter noise component (line (c)). When the drive current is analyzed in the frequency domain, the noise components are found to be at the frequency $f_{PWM}$ and its harmonics, typically at 4 kHz and above.

A straightforward approach to eliminating the noise would seem to be simply to attenuate the frequency components above 4 kHz by using a low pass conventional filter. This method, however, would impact two incompatible requirements:

To obtain a signal to noise ratio on the order of 60 dB requires a sharp transition, which requires many poles (order >5) near 500 Hz.

To avoid an excessive delay in the control loop, the filter must introduce a very small phase delay in the passband, which requires a low order filter and poles far from 500 Hz.

Because of these conflicting requirements, the low pass filter approach cannot effectively be used.

In practice, the noise components of the phase currents are dealt with in one of two conventional ways. One approach is to sample the current signal at a random frequency without any synchronization with the PWM signal. This solution, however, does not reject ripple and high frequency noise (leaving a noise component as high as 30% of the signal).

Another approach is synchronous sampling with the transitions of the triangular wave. If the carrier frequency is much higher than the frequency of the PWM reference signal, the ripple component of the current signal is theoretically null at the positive and negative peaks of the triangular wave. The current is sampled at these instants. This solution is not sufficient to obtain 60 dB (equivalent to 10 bits of resolution) of signal to noise ratio during the normal operation of the system because high frequency asynchronous noise and dead time in the inverter's switching deteriorate the S/N ratio.

It is also possible to use a broadband sensor coupled with a filter. This, however, is expensive, and requires tradeoff between residual ripple and processing delay.

In summary, none of the conventional methods are able to totally solve the problem of ripple or to react with a delay smaller than half the PWM period. It would therefore be extremely desirable to have a better way for eliminating or minimizing the high frequency noise components while also providing rapid response to phase current changes. The present invention seeks to satisfy that need.

SUMMARY OF THE INVENTION

It is accordingly an object of the present invention to provide an improved input filter for phase current sensing in PWM motor drives.

A further object of this invention is to provide an improved input filter which effectively reduces high frequency noise in the phase current feedback signal at the frequency of the PWM triangular wave and harmonics thereof.

A related object of this invention is to provide such an improved input filter which also exhibits rapid response to phase current changes.

Another object of the invention is to provide an input filter which is self-adaptive to the changes in the switching characteristics of the inverter These objects are achieved according to the invention, in a PWM motor drive system of the type described by an improved input filter for the gate driver control circuit which includes an integration circuit having an operating cycle triggered by a SYNC signal generated by the system microcontroller at a frequency which is an integer multiple or ratio of the frequency $f_{PWM}$ of the triangular wave. Preferably, the frequency is twice the frequency of the triangular wave.

According to one aspect of the invention, the improved input filter includes an integration circuit comprised of a first integrator coupled directly to a signal representing the motor drive current, a second integrator coupled to the motor drive current signal through a delay circuit which introduces a delay equal to one-half the period of the PWM triangular wave, a subtraction circuit coupled to outputs of the first and second integrators, and a sample and hold circuit operated at twice the frequency $f_{PWM}$.

According to a second aspect of the invention, the integration circuit is comprised of a voltage-to-time converter which integrates the phase current signal over a first interval equal to one-half the period of the PWM triangular wave, which reduces the value of the integrated phase current signal during a succeeding half-period of the PWM triangular wave by the integrated value of a reference signal of opposite polarity to the motor drive current signal, and which provides an indication when an output from the integration circuit returns to a predetermined level (e.g., zero) during the second interval.

Further according to the second aspect of the invention, the voltage to time converter includes an integrator, a first switching element which couples the phase current signal to an input of the integrator, and a second switching element which couples the reference signal to the integrator input, in which the first switching element is alternatingly turned on and off for successive first and second intervals equal to the half-period of the PWM triangular wave, the second switching element is turned off during the first interval and is turned on during the second interval, and which includes a level detector which provides an indication when the integrator output returns to the zero level during the second interval.

Still further according to the second aspect of the invention, the filter circuit is comprised of a second voltage to time converter which includes a second integrator, a third switching element which couples the motor drive current signal to an input of the second integrator, and a fourth switching element which couples the reference signal to the input of the second integrator, and in which the third switching element is alternatingly turned on during the second interval and turned off during the first interval, the fourth switching element is turned on during the first interval and is turned off during the second interval; and in which the level detector provides an indication when an output from the second integrator returns to the zero level during the first interval.

According to a third aspect of the invention, the improved filter is comprised of a switched capacitor (SC) integration circuit operated by a high-speed clock synchronized with a SYNC signal generated by the system microcontroller at the frequency of the PWM triangular wave connected to an analog to digital converter (ADC) through a sampling switch which samples the integrator output every half-period of the SYNC signal.

Other features and advantages of the present invention will become apparent from the following description of the invention which refers to the accompanying drawings.

BRIEF DESCRIPTION OF THE DRAWINGS

Throughout the drawings, like parts are designated by like reference numerals.

DETAILED DESCRIPTION OF THE INVENTION

Figure 3:
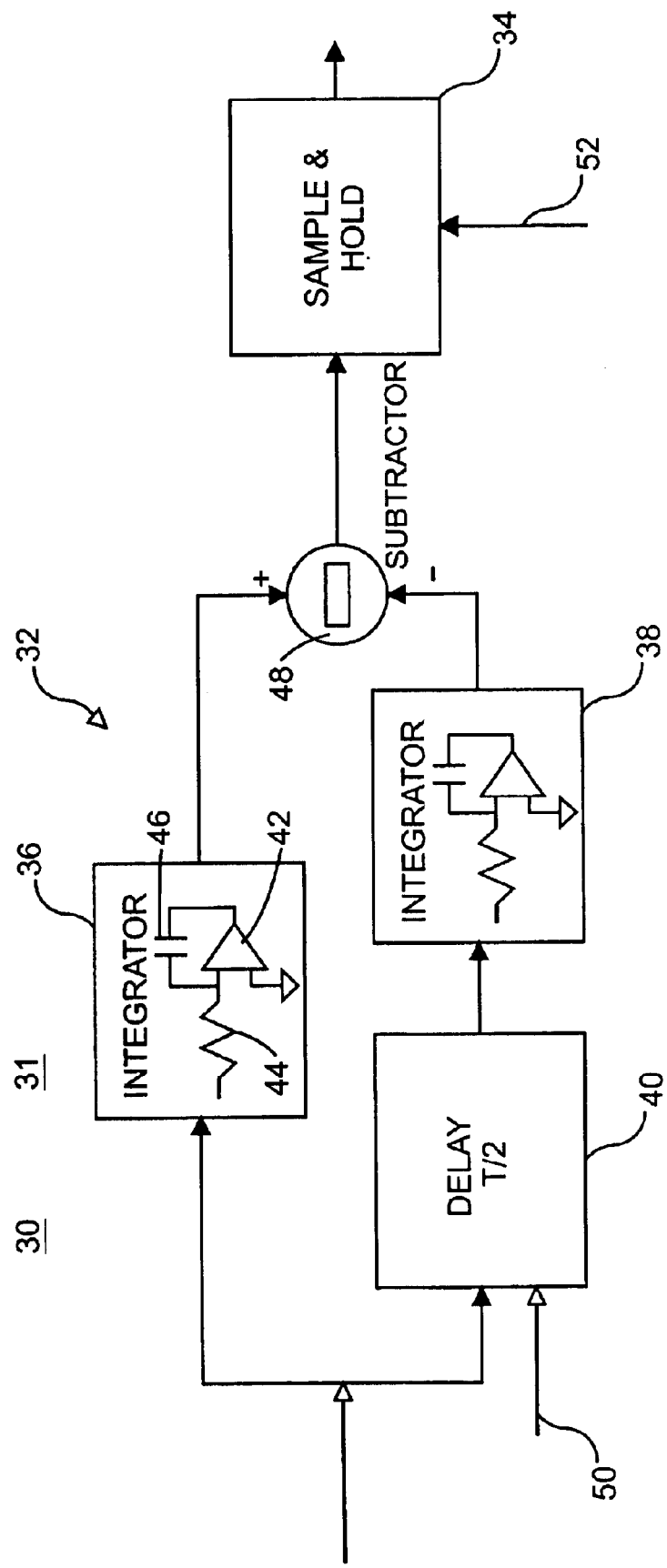
FIG. 3 is a schematic diagram which shows the underlying concept of a first embodiment of the invention.
Figure 4A:
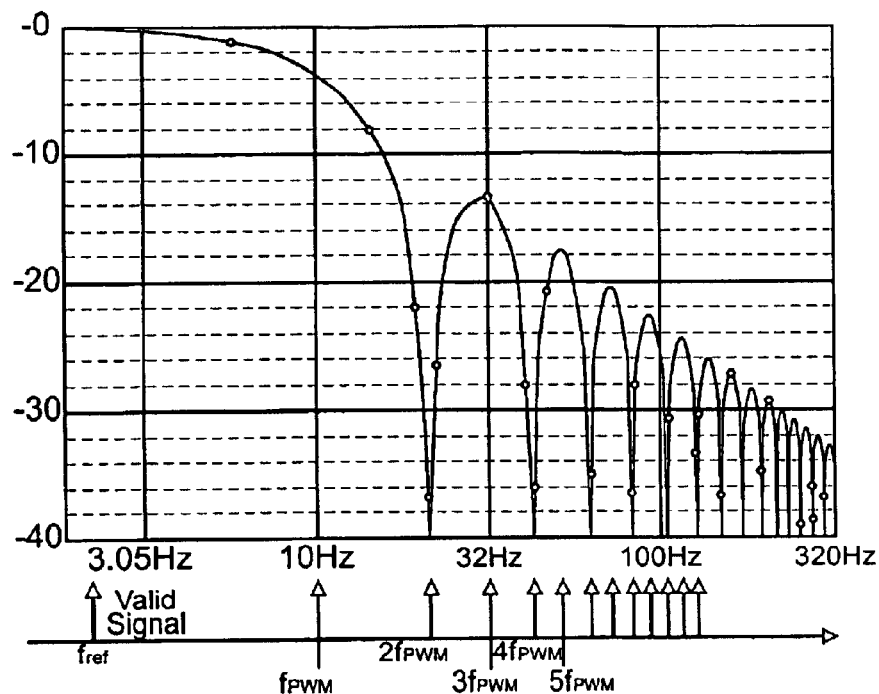
FIGS. 4A and 4B illustrate the operation of the first embodiment.
Figure 4B:
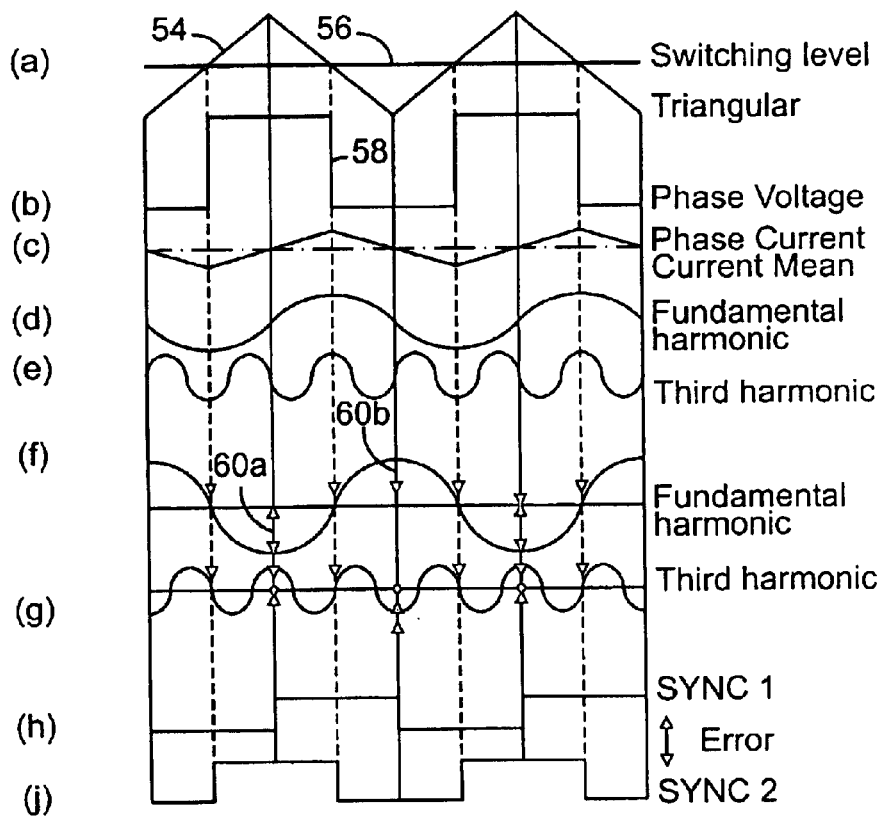

Referring to FIG. 3, in a first embodiment of the invention, the input filter, generally denoted at 31, is comprised of a two-stage integration circuit 32 and a sample and hold circuit 34, which is operated by the transitions of a SYNC signal generated by a system microcontroller (not shown) at a frequency $f_s$ equal to twice the frequency $f_{PWM}$ of the PWM triangular wave. The relationship between the triangular wave, the SYNC signal, and the sampling frequency derived from the SYNC signal is illustrated in FIGS. 4A and 4b, and described in detail below. As will be understood, a separate filter circuit 31 is provided for each motor phase.

Figure 1:
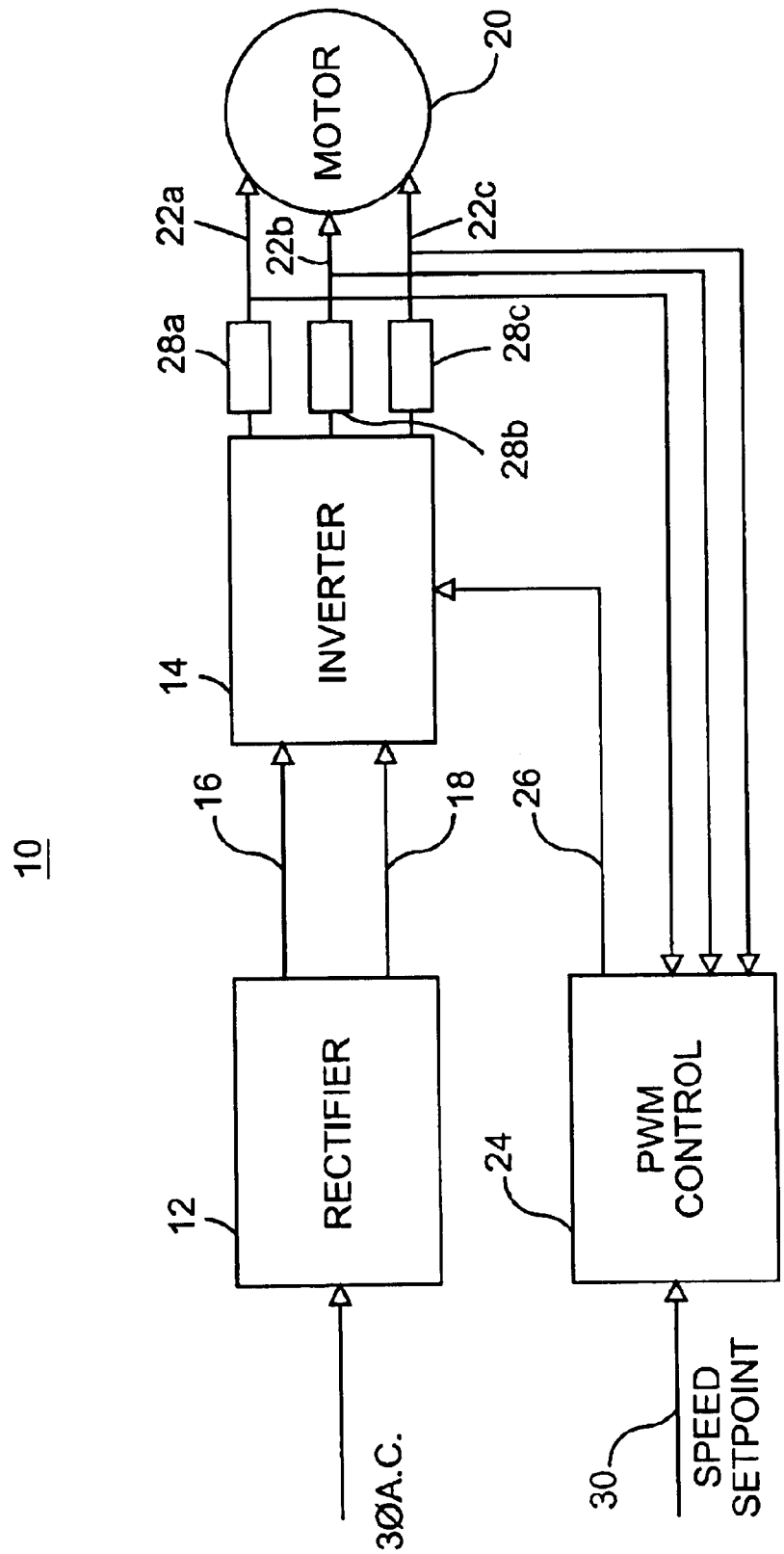
FIG. 1 is a schematic diagram which shows the basic features of a conventional PWM switched motor drive.

Referring still to FIG. 3, integration circuit 32 includes a first integrator 36 coupled directly to the phase current signal provided by the voltage drop across the resistor 28 signal (see FIG. 1) for one of the phase currents. A second integrator 38 is connected to the phase current signal through a delay circuit 40 which delays its input by one half of the period of the SYNC signal. Control for delay circuit 40 may be provided directly by the SYNC signal through signal path 50 from the system controller, typically a digital signal processor (DSP), not shown. Sample and hold circuit 34 may similarly be controlled by the SYNC signal provided through signal path 52.

Integrators 36 and 38 may be constructed in any suitable manner, e.g., using amplifiers 42 having series input resistors 44 and integrating capacitors 46 coupled between the amplifier inputs and outputs.

The outputs of integrators 36 and 38 are connected to a subtraction circuit 48 which subtracts the integral of the phase current signal from the integral of the phase current signal delayed by one-half the SYNC period. Thus, the output of subtraction circuit 48 is in the form:

$$\int_{t-T/2}^{t} Vin(\tau)d\tau \tag{1}$$

where Vin is the phase current signal for the phase in question, and T is the period of the SYNC signal.

FIG. 4A illustrates the transfer function of integration circuit 32. The integral over the interval T/2 has a frequency response similar to a single real pole at the frequency $f_{PWM}$, so high frequency noise (i.e., above $f_{PWM}$) is rejected to a significant degree. Moreover, the transfer characteristic exhibits multiple transmission zeroes at exactly the even harmonics, so these frequencies are attenuation to a very high degree.

Sample and hold circuit 34, which may be constructed in any conventional fashion, functions to attenuate the fundamental frequency and the odd harmonics of $f_{PWM}$. This is illustrated in FIG. 4B. Here, line (a) illustrates the triangular carrier wave 54 with a superimposed switching level 56 which represents the desired phase current. As shown in line (b), when the triangular wave is above the switching level, the inverter (see FIG. 1) operates to generate a voltage in the form of a square wave 58 having a duty cycle determined by the required phase current for the motor.

The resulting phase current, which is a ramp due to the inductive motor load, is shown in simplified form in line (c). The ripple (noise) includes components at a succession of harmonics of the fundamental frequency $f_{PWM}$, but for simplicity, only the fundamental and the third harmonic are shown in lines (d) and (e) since integration circuit 32 eliminates the even harmonics, as previously described. Lines (f) and (g) illustrate the signal at the output of subtraction circuit 48. Since integration circuit 32 is comprised of two parallel integration paths, the effect is to introduce a phase shift of 90° (one-quarter period) in the fundamental and odd harmonics.

Lines (h) and (i) show two alternative SYNC signals for operating filter 31. The first alternative, line (h), is a square wave having its level transitions coincident with the direction changes of the triangular wave (line (a)). The second alternative, line (i), is shifted in phase by 90° so that its level transitions coincide with the zero crossings of the triangular wave.

As previously noted, sample and hold circuit 34 is operated on each transition of the SYNC signal, i.e., at a frequency equal to $2f_{PWM}$. In lines (f) and (g) of FIG. 3B, the sample times for the SYNC signal of line(h) are shown by the upward pointing arrows. As may be seen, the fundamental, and third harmonics (and other odd harmonics) are at maximum levels at these sample times, and are therefore not rejected by the sample and hold operation, but the current data is available with only a small delay relative to the directional transitions of the triangular wave.

When the motor control system reaches its steady state, the motor current changes very slightly between periods of $f_{PWM}$. This is the case when the overall system requires the highest precision. It will also be observed, however, that because changes in motor load or set speed will occur over time intervals which are longer than the period of the triangular wave 54, successive samples of the fundamental, e.g., samples 60a and 60b will be substantially equal amplitude but opposite polarity. The same will, of course, be true of the odd harmonics. Therefore, the DSP can obtain a mean value of successive samples, and thus provide effective attenuation of these frequencies, at the cost of an additional one-half period delay.

More effective rejection of the fundamental and odd harmonics can be achieved using the second form of SYNC signal shown in line (i). For this, downward pointing arrows show the sample times. As maybe seen, the fundamental, third, and all the other odd harmonics are at minimum levels at these sample times, and are therefore strongly rejected by the sample and hold operation. This produces better filtering at the cost of only the 90° phase shift relative to the directional transitions of the triangular wave introduced by the integration process, as may be seen by comparing lines (d) and (f), and lines (e) and (g) of FIG. 4B.

Figure 2:
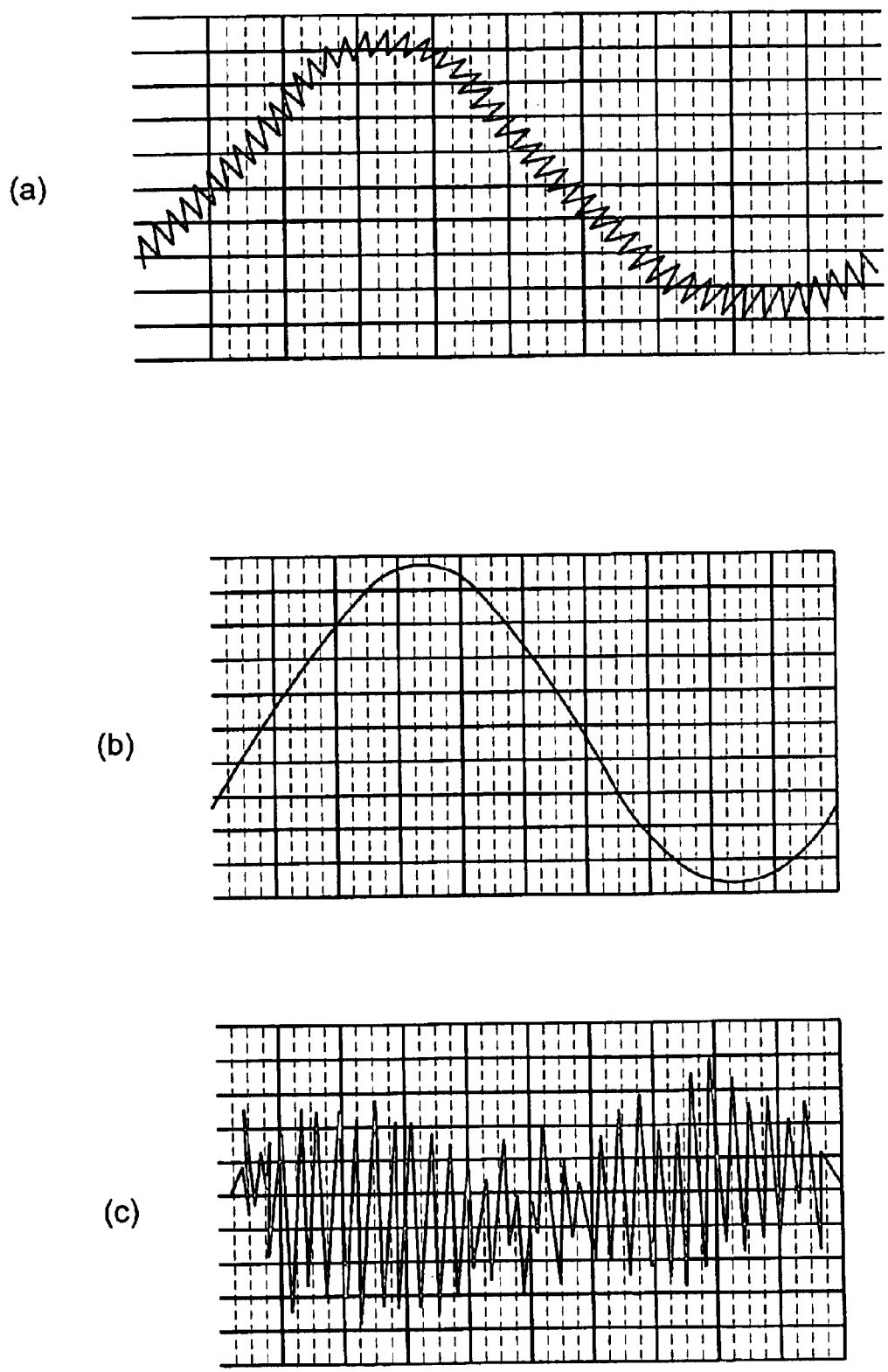
FIG. 2 is a waveform diagram showing the motor drive current including the signal and noise (ripple) components.
Figure 5:
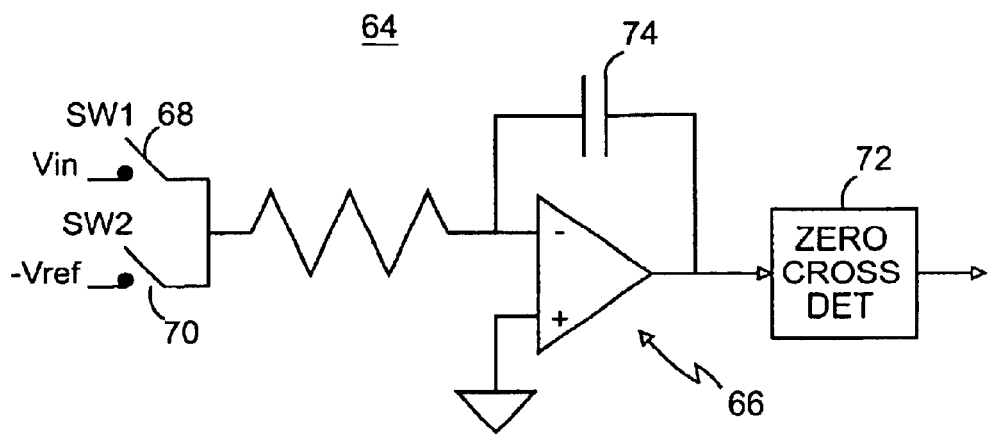
FIG. 5 is a schematic diagram illustrating the implementation of a second embodiment of the invention.

An alternative implementation of the concepts of the first embodiment, generally denoted at 64, is illustrated in FIG. 5. Here, the integration and sample and hold functions are merged into a single circuit, which functions as a dual ramp integrator. Filter circuit 64 comprises a single integrator 65 having the same construction as integrators 36 and 38 in FIG. 2, with an input resistor 66 connected to first and second switches 68 and 70. The gating of switches 68 and 70 is controlled by the level transitions of the SYNC square wave, with switch 68 being turned on for the first half cycle, and turned off for the second half cycle. Conversely, switch 70 is turned off for the first half cycle, and turned on for the second half cycle. The output of integrator 66 is connected to a level detector 72, preferably, a zero crossing detector, as explained below.

Switch 68 is connected to the phase current signal, while switch 70 is connected to a reference signal having amplitude Vref, and a polarity opposite to that of the phase current signal.

Figure 6:
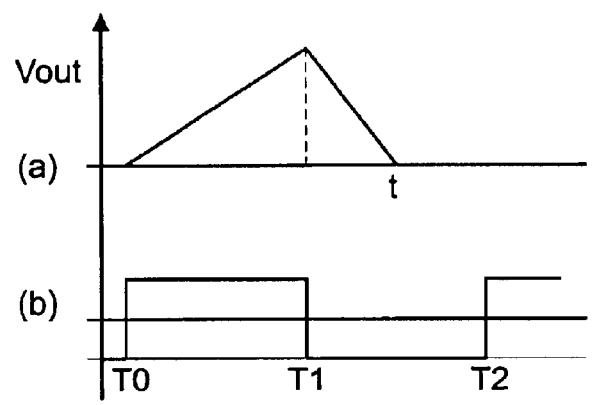
FIG. 6 illustrates the operation of the second embodiment.
Figure 6:
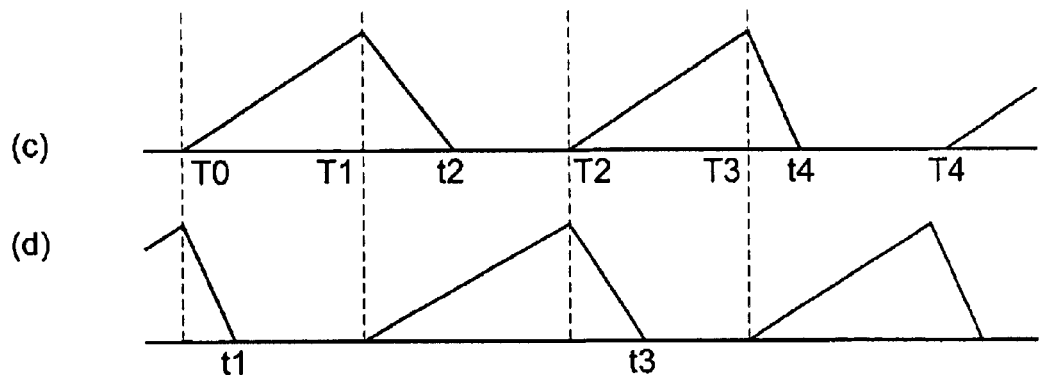

The operation of the circuit of FIG. 5 is illustrated in FIG. 6. As shown in lines (a) and (b), the first half period of the SYNC signal from $T_0$ to $T_1$, is an integration period during which the incoming phase current signal is integrated to a level $V_{OUT}$ proportional to the product of the phase current signal amplitude and the integration period $T_{PWM}/2$ divided by the RC time constant of integrator 65, i.e.

$$Vout = \frac{Vin}{RC} * \frac{T_{PWM}}{2} \quad (2)$$

The second half period of each SYNC signal is a zero-level computation period during which the value of the integrator output obtained during the first half period is reduced by negative integration of the reference signal Vref. Starting with the value of Vout after the first half period, the integrator output Vout' after a time t will be $$Vout - \frac{Vref}{RC} * \frac{t}{2} \quad (3)$$

Zero crossing detector 72 determines the time t required for the negative integration of the reference signal to reduce the integrator output signal to zero. By equating Vout for the integration period with Vout' for the conversion period $t-T_1$, one obtains:

$$Vin*T_{PWM}/2=Vref*t \text{ or} \quad (3)$$

$$Vin=Vref*2t/T_{PWM}. \quad (4)$$

The circuit according to the second embodiment avoids saturation problems of continuous time integrators, does not need any analog delay and the integrator capacitor also performs a sample and hold function to store the analog information. Furthermore, the output is a time interval, useful for driving an integrated level shifter. In addition, the use of the dual ramp method eliminates the effects of the RC time constant of the integrator 66 and non-linearity of integrator capacitor 74 due, for example, to temperature variations or manufacturing tolerances.

Because the dual ramp implementation requires a first half-cycle of the SYNC square wave for the integration and part of the second half-cycle for computation of the return to zero time t, there will be a time interval $T_{PWM}-t$ at the end of the second half-cycle during which new phase current information is not obtainable. To avoid this, in the dual ramp embodiment, two separate integration circuits may be employed. The remaining time in between the end of the voltage to time conversion and the start of a new conversion can be effectively employed to accomplish offset compensation tasks on opamp 66.

In FIG. 6B, with the SYNC square wave and the triangular PWM carrier as illustrated in lines (a) and (b), a first integrator (line (c)) performs integration during the first half-cycles ($T_0$ to $T_1$, $T_2$ to $T_3$, etc.), and zero-level computation (and offset compensation) during the second half-cycles ($T_1$ to $T_2$, $T_3$ to $T_4$). Conversely, a second integrator (line (d)) performs zero-level computation and offset compensation during the first half-cycles ($T_0$ to $T_1$, $T_2$ to $T_3$, etc.), and integration during the second half-cycles ($T_1$ to $T_2$, $T_3$ to $T_4$).

Figure 7:
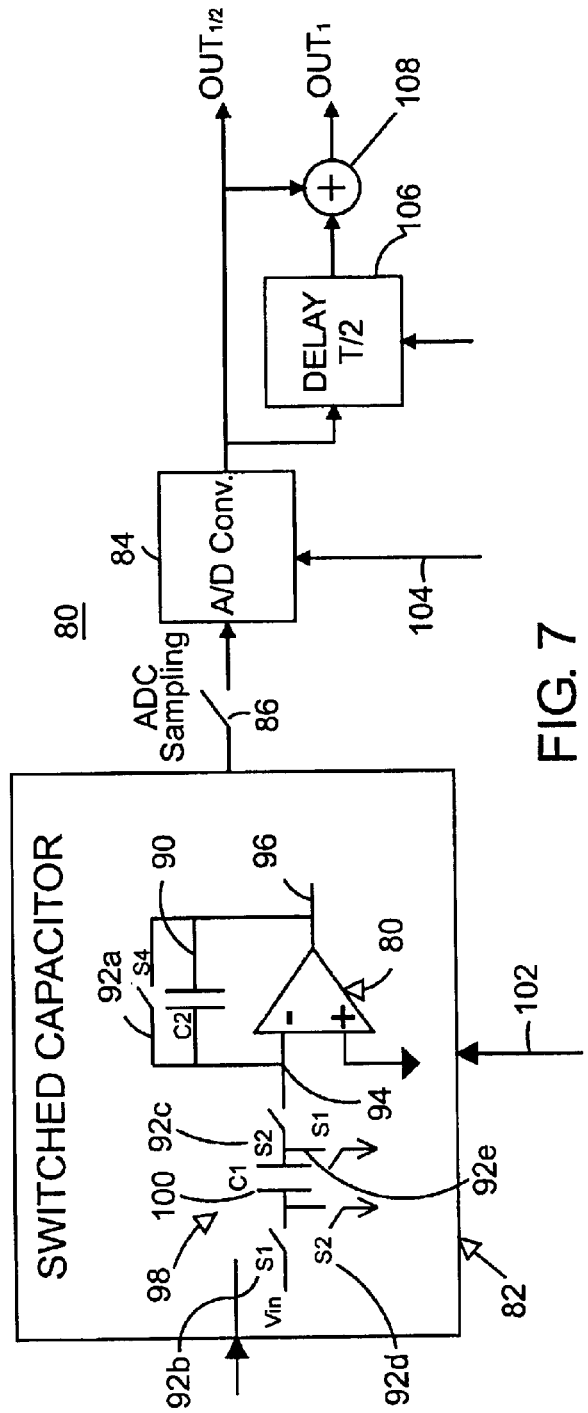
FIG. 7 is a schematic circuit illustrating the implementation of a third embodiment of the invention.

Another embodiment of the principles of this invention, as illustrated at 80 in FIG. 7, employs a switched capacitor (SC) integrator 82 coupled to an analog to digital converter (ADC) 84 through a sampling switch 86. This embodiment has the advantage of requiring only a single integrator for each motor phase, and provides directly noise immune digital signals representing the measured current.

Figure 8:
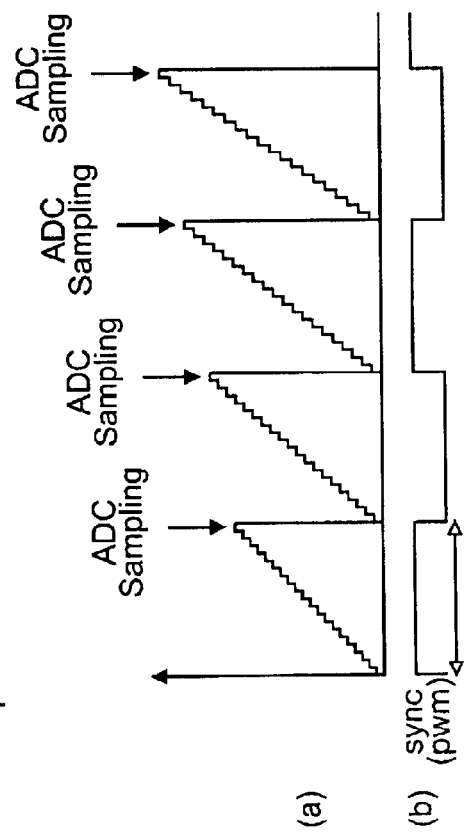
FIG. 8 illustrates the operation of the third embodiment.

Various forms of SC integrators are known, and any suitable design may be adopted for this device according to the invention, as will be appreciated by those skilled in the art. For purposes of illustration, however, as shown in FIG. 7, SC integrator 82 is comprised of an amplifier 88 having an integration capacitor 90 and a capacitor shunt switch 92a connected between amplifier input 94 and output 96. A series input circuit 90 including a first switch 92b, a capacitor 100, and a second switch 92c, and grounding switches 92d and 92e connected to opposite ends of capacitor 100, is also connected to input 94. Switches 86 and 92a–92e are driven by a high speed clock synchronized with the SYNC signal over respective signal lines 102 and 104 by a phase locked loop (not shown). Typically, this clock would run between 32 and 64 times faster than the SYNC frequency Switches 92b and 92e are operated simultaneously by one phase of the high speed clock, while switches 92c and 92d are operated by a second, non-overlapping phase of the clock. Sampling switch 86 operates just before the end of each half-period of the SYNC square wave to pass the integrated value to ADC 84. Switch 92a is operated after sampling switch 86, e.g., at the SYNC signal transitions, to reset integrator 82. FIG. 8 shows the waveform at integrator output 96 (line a) in relation to the SYNC signal (line b). Since the integrator 82 can be reset at the beginning of each half-period of the SYNC signal, dual integrators operating in alternating half-periods are not required, as in the dual ramp embodiment of FIGS. 5 and 6.

Referring again to FIG. 7, in addition to the direct output provided by ADC 84, a second output can be provided in the form of a summation of two successive samples. This may be accomplished by coupling the ADC output signal through a delay circuit 106, which introduces a delay equal to one-half of the SYNC period, to a summing circuit 108 which adds the delayed and undelayed signals. The composite signal provided by addition circuit 108 exhibits a better signal to noise ratio than the undelayed signal alone.

As may be appreciated by those skilled in the art from the disclosure herein, the integrating filter configurations according to this invention provide effective filtering with good signal to noise characteristics, and can be simply implemented as part of the conventional components of a PWM motor control system. These filter configurations also have the benefit of being self-adaptive, i.e., the transmission zeroes and the overall shape of the filter transfer function changes to reject precisely the noise harmonics introduced by the switching of the inverter, as far as the changes are tracked by the correct SYNC signal.

In this regard, it will be understood that normally, the frequency of the triangular wave is fixed for a given inverter, but even if the frequency changes when the system is running, these filters are able to track the changes and operate correctly, subject, in the case of the embodiment of FIGS. 7 and 8, to any latency time needed for the PLL to lock to the new frequency.

Although the present invention has been described in relation to particular embodiments thereof, other variations and modifications and other uses will become apparent to those skilled in the art from the description. It is intended therefore, that the present invention not be limited not by the specific disclosure herein, but to be given the full scope indicated by the appended claims.

What is claimed is:

1. A motor drive system comprising:
   an input for alternating current;
   a rectifier circuit operative to convert the input alternating current to direct current;
   an inverter circuit operable to convert the direct current to PWM current pulses at a selected frequency and a controllable duty cycle for driving a motor;
   a PWM control circuit responsive to signals representative of the motor drive current and to a carrier signal at the selected frequency to operate the inverter; and
   a motor drive current sensing circuit which provides a control input to the PWM control circuit, and which includes an input filter operative to block noise components of the motor drive current signal, wherein:
   the input filter is comprised of an integration circuit, and is driven by a triggering signal at a frequency which is an integer multiple of the selected frequency.

2. A motor drive system as described in claim 1, wherein the triggering signal is derived from a SYNC signal at the selected frequency, and which has a predetermined phase relationship to the carrier signal.

3. A motor drive system as described in claim 2, wherein the carrier signal is a triangular wave, the SYNC signal is a square wave, and the triggering signal is derived from level transitions of the square wave at zero crossings of the triangular wave, or at direction transitions of the triangular wave.

4. A motor drive system as described in claim 1, wherein the integration circuit triggering signal frequency is twice the selected frequency.

5. A motor drive system as described in claim 4, wherein the integration circuit is comprised of:
   a first integrator coupled directly to the motor drive current signal;
   a second integrator coupled to the motor drive current signal through a delay circuit which introduces a delay equal to the period of the integration circuit triggering signal; and the filter further includes:
   a subtraction circuit coupled to outputs of the first and second integrators; and
   a sample and hold circuit operated at the integration circuit triggering signal frequency.

6. A motor drive system as described in claim 5, wherein the integration circuit is operative to suppress even harmonics of the selected frequency.

7. A motor drive system as described in claim 5, wherein the sample and hold circuit is operative to suppress the selected frequency and odd harmonics thereof.

8. A motor drive system as described in claim 7, further including a circuit operative to determine the mean value of two successive outputs of the sample and hold circuit.

9. A motor drive system as described in claim 4, wherein:
   the integration circuit is comprised of a voltage-to-time converter including:
   an integrator;
   a first switching element which couples the motor drive current signal to an input of the integrator; and
   a second switching element which couples a reference signal to the integrator input;
   the reference signal is opposite in polarity to the motor drive current signal;
   the first switching element is alternatingly turned on and off for successive first and second intervals equal to the period of the integration circuit triggering signal;
   the second switching element is turned off during the first interval and is turned on during the second interval;

the input filter further includes a level detector operative to provide an indication when an output from the integration circuit returns to a predetermined level during the second interval equal to the level at the beginning of the first interval.

10. A motor drive system as described in claim 9, wherein the integration circuit is further comprised of a second voltage to time converter including:
   a second integrator;
   a third switching element which couples the motor drive current signal to an input of the second integrator; and
   a fourth switching element which couples the reference signal to the input of the second integrator; wherein:
   the third switching element is alternatingly turned on during the second interval and turned off during the first interval;
   the fourth switching element is turned on during the first interval and is turned off during the second interval; and
   the level detector is operative to provide an indication when an output from the second integrator returns to a second predetermined level during the first interval equal to the level at the beginning of the second interval.

11. A motor drive system as described in claim 10, wherein the level detector is a zero-crossing detector.

12. A motor drive system as described in claim 4, wherein the integration circuit includes a switched capacitor integrator operated by switching pulses synchronized with the triggering signal, the switching pulses having a frequency which is a high multiple of the selected frequency.

13. A motor drive system as described in claim 12, further including a sampling switch connected between an output of the integrator and an input of an analog to digital converter, the sampling switch being operated at the frequency of the integration circuit triggering signal.

14. A motor drive system as described in claim 13, further including a delay circuit connected to an output of the analog to digital converter, and a summing circuit operative to add the delayed and undelayed outputs of the analog to digital converter 15. A motor drive system as described in claim 14, wherein the current sensing circuit further includes:
   a resistance element in series between an output of the inverter and the motor; and
   a circuit for measuring the voltage drop across the resistance element.

16. A motor drive system as described in claim 1, wherein:
   the motor drive system is operative to drive a multi-phase motor;
   the inverter circuit is operable to provide current pulses in a predetermined phase relationship for each phase of the motor at the selected frequency and the controllable duty cycle;
   the control circuit is responsive to signals representative of the motor drive current for each phase of the motor; and
   the motor drive current sensing circuit includes an input filter for each of the motor drive phase current signals.

17. An input filter for eliminating ripple noise in a phase current sensing circuit for a PWM motor drive system which provides motor drive signals in the form of current pulses derived from a carrier signal at a selected frequency and a controllable duty cycle for driving a motor,
   the filter being comprised of an integration circuit driven by a triggering signal at a frequency which is an integer multiple of the selected frequency.

18. An input filter as described in claim 17, wherein the triggering signal is derived from a SYNC signal at the selected frequency, and which has a predetermined phase relationship to the carrier signal.

19. An input filter as described in claim 18, wherein the carrier signal is a triangular wave, the SYNC signal is a square wave, and the triggering signal is derived from level transitions of the square wave at zero crossings of the triangular wave, or at direction transitions of the triangular wave.

20. An input filter as described in claim 17, wherein the integration circuit triggering signal frequency is twice the selected frequency.

21. An input filter as described in claim 20, wherein the integration circuit is comprised of:
   a first integrator coupled directly to the motor drive current signal;
   a second integrator coupled to the motor drive current signal through a delay circuit which introduces a delay equal to the period of the integration circuit triggering signal; and the filter further includes:
   a subtraction circuit coupled to outputs of the first and second integrators; and
   a sample and hold circuit operated at the integration circuit triggering signal frequency.

22. An input filter as described in claim 21, wherein the integration circuit is operative to suppress even harmonics of the selected frequency.

23. An input filter as described in claim 21, wherein the sample and hold circuit is operative to suppress the selected frequency and odd harmonics thereof.

24. An input filter as described in claim 23, further including a circuit operative to determine the mean value of two successive outputs of the sample and hold circuit.

25. An input filter as described in claim 20, wherein:
   the integration circuit is comprised of a voltage-to-time converter including:
   an integrator;
   a first switching element which couples the motor drive current signal to an input of the integrator; and
   a second switching element which couples a reference signal to the integrator input;
   the reference signal is opposite in polarity to the motor drive current signal;
   the first switching element is alternatingly turned on and off for successive first and second intervals equal to the period of the integration circuit triggering signal;
   the second switching element is turned off during the first interval and is turned on during the second interval;
   the input filter further includes a level detector operative to provide an indication when an output from the integration circuit returns to a predetermined level during the second interval equal to the level at the beginning of the first interval.

26. An input filter as described in claim 25, wherein the integration circuit is further comprised of a second voltage to time converter including:
   a second integrator;
   a third switching element which couples the motor drive current signal to an input of the second integrator; and
   a fourth switching element which couples the reference signal to the input of the second integrator; wherein:
   the third switching element is alternatingly turned on during the second interval and turned off during the first interval;

the fourth switching element is turned on during the first interval and is turned off during the second interval; and level detector is operative to provide an indication when an output from the second integrator returns to a second predetermined level during the first interval equal to the level at the beginning of the second interval.

27. An input filter as described in claim 26, wherein the level detector is a zero-crossing detector.

28. An input filter as described in claim 20, wherein the integration circuit includes a switched capacitor integrator operated by switching pulses synchronized with the triggering signal, the switching pulses having a frequency which is a high multiple of the selected frequency.

29. An input filter as described in claim 28, further including a sampling switch connected between an output of the integrator and an input of an analog to digital converter, the sampling switch being operated at the frequency of the integration circuit triggering signal.

30. An input filter as described in claim 29, further including a delay circuit connected to an output of the analog to digital converter, and a summing circuit operative to add the delayed and undelayed outputs of the analog to digital converter.

* * * * *